United States Patent [19]

Manning

[11] Patent Number: 5,710,740
[45] Date of Patent: *Jan. 20, 1998

[54] CIRCUIT INCLUDING DRAM AND VOLTAGE REGULATOR, AND METHOD OF INCREASING SPEED OF OPERATION OF A DRAM

[75] Inventor: Troy A. Manning, Boise, Id.

[73] Assignee: Micron Technology, Inc., Boise, Id.

[21] Appl. No.: 717,836

[22] Filed: Sep. 23, 1996

[*] Notice: The term of this patent shall not extend beyond the expiration date of Pat. No. 5,596,534.

Related U.S. Application Data

[63] Continuation of Ser. No. 495,338, Jun. 27, 1995, Pat. No. 5,596,534.

[51] Int. Cl.$^6$ .................................................. G11C 7/00
[52] U.S. Cl. ...................... 365/222; 365/226; 365/189.09
[58] Field of Search ................................ 365/222, 226, 365/189.09, 193, 206

[56] References Cited

U.S. PATENT DOCUMENTS

| | | | |
|---|---|---|---|
| 4,030,084 | 6/1977 | Fisher et al. | 365/222 |
| 4,961,167 | 10/1990 | Kumanoya et al. | 365/189.09 |
| 5,163,025 | 11/1992 | Chamberlain | 365/226 |
| 5,596,534 | 1/1997 | Manning | 365/189.09 |

OTHER PUBLICATIONS

"A New On-Chip Voltage Regulator for High Density CMOS DRAMs" by R.S. Mao et al., 1992 Symposium on VLSI Circuits Digest of Technical Papers, IEEE, 1992.

*Primary Examiner*—Joseph A. Popek
*Attorney, Agent, or Firm*—Wells, St. John, Roberts, Gregory & Matkin, P.S.

[57] ABSTRACT

An integrated circuit comprising a reference voltage generator having an output providing a reference voltage; a selectively engageable filter having an input connected to the output of the reference voltage generator, and having an output; a voltage regulator having an input connected to the output of the filter, and having an output; a dynamic random access memory receiving power from the output of the voltage regulator, the dynamic random access memory having memory cells that are accessed or refreshed in response to a first signal; and a timing circuit which engages the filter in response to presence of a first signal, and causes the filter to filter the reference voltage. A method of increasing the speed of operation of an integrated circuit including a dynamic random access memory having memory cells which are individually accessed in response to a signal, including a reference voltage generator having an output, and including a voltage regulator which accepts the output of the reference voltage generator and supplies voltage to the dynamic random access memory, the method comprising filtering the output of the reference voltage generator in response to the signal.

26 Claims, 5 Drawing Sheets

CIRCUIT INCLUDING DRAM AND VOLTAGE REGULATOR, AND METHOD OF INCREASING SPEED OF OPERATION OF A DRAM

CROSS REFERENCE TO RELATED APPLICATION

This is a continuation of application Ser. No. 08/495,338, filed Jun. 27, 1995, and titled "Circuit Including DRAM and Voltage Regulator, and Method of Increasing Speed Operation of a DRAM" listing inventor as Troy Manning, now U.S. Pat. No. 5,596,534.

TECHNICAL FIELD

This invention relates to dynamic random access memory integrated circuits.

BACKGROUND OF THE INVENTION

Integrated circuits including dynamic random access memory (DRAM) devices are known in the art.

A DRAM is a device which includes a plurality of memory cells, and a plurality of row lines and column lines, wherein each memory cell is connected to both a row line and a column line. The row lines and column lines form a two-dimensional matrix having a plurality of intersections. A single memory cell is associated with each intersection between a row line and a column line. At each intersection, a row line is connected to selectively activate the corresponding memory cell. The memory cell includes a storage capacitor which is connected to the corresponding column line to allow conventional memory access operations such as reading, writing, or refreshing.

Many DRAMS are required to operate in mixed voltage systems. To accommodate such operation, the integrated circuits containing the DRAMS also include on-chip voltage regulators to regulate voltage down to a desired voltage range. Such voltage regulators are discussed in an article titled "A New On-chip Voltage Regulator for High Density CMOS DRAMs" by R. S. Mao et al, 1992 Symposium on VLSI Circuits Digest of Technical Papers, IEEE, 1992, which is incorporated herein by reference.

The voltage regulator uses the voltage supplied to the integrated circuit ($V_{CC}$) as a reference. A problem with such regulator design is that when active pullup of a row line or column line occurs, for accessing of a memory cell, the supply voltage $V_{CC}$ drops. The drop in the supply voltage can be from several hundred millivolts to up to one volt. This causes problems with the voltage regulator which uses the supply voltage as a reference. Even though voltage regulators are designed to stabilize an output voltage against fluctuations in source or load, the reduction in the supply voltage is sufficiently drastic to cause the voltage regulator to reduce the operating voltage of the DRAM. This slows operation of the DRAM.

BRIEF DESCRIPTION OF THE DRAWINGS

FIG. 4 is a circuit diagram illustrating circuitry included in the integrated circuit of FIG. 1, the circuitry being powered by a voltage source VCCX.

DETAILED DESCRIPTION OF THE PREFERRED EMBODIMENT

This disclosure of the invention is submitted in furtherance of the constitutional purposes of the U.S. Patent Laws "to promote the progress of science and useful arts" U.S. Constitution, Article 1, Section 8.

The invention provides an integrated circuit comprising a reference voltage generator having an output providing a reference voltage; a selectively engageable filter having an input connected to the output of the reference voltage generator, and having an output; a voltage regulator having an input connected to the output of the filter, and having an output; a dynamic random access memory receiving power from the output of the voltage regulator, the dynamic random access memory having memory cells that are accessed or refreshed in response to a first signal; and a timing circuit which engages the filter in response to the first signal, and causes the filter to filter the reference voltage.

One aspect of the invention provides an integrated circuit comprising a reference voltage generator having an output providing a reference voltage; a selectively engageable low pass filter having an input connected to the output of the reference voltage generator, and having an output; a voltage regulator having an input connected to the output of the low pass filter, and having an output; a dynamic random access memory receiving power from the output of the voltage regulator; and a timing circuit which engages the low pass filter in response to the presence of a signal, wherein the low pass filter filters the reference voltage for a period of time during which the signal is present.

One aspect of the invention provides a method of increasing the speed of operation of a dynamic random access memory having memory cells which are individually accessed in response to a signal, including a reference voltage generator having an output, and including a voltage regulator which accepts the output of the reference voltage generator and supplies voltage to the dynamic random access memory, the method comprising filtering the output of the reference voltage generator in response to the signal.

One aspect of the invention provides a circuit comprising a dynamic random access memory having a memory cell, which memory cell is selectively accessed in response to a signal; a voltage regulator which supplies an operating voltage to the dynamic random access memory; and means, other than the voltage regulator, for maintaining the operating voltage steady during reading and writing to the memory cell.

One aspect of the invention provides a circuit comprising a dynamic random access memory having a memory cell which is selectively refreshed in response to a signal; a voltage regulator which supplies an operating voltage to the dynamic random access memory; and means, other than the voltage regulator, for maintaining the operating voltage steady during refreshing of the memory cell.

Figure 1:
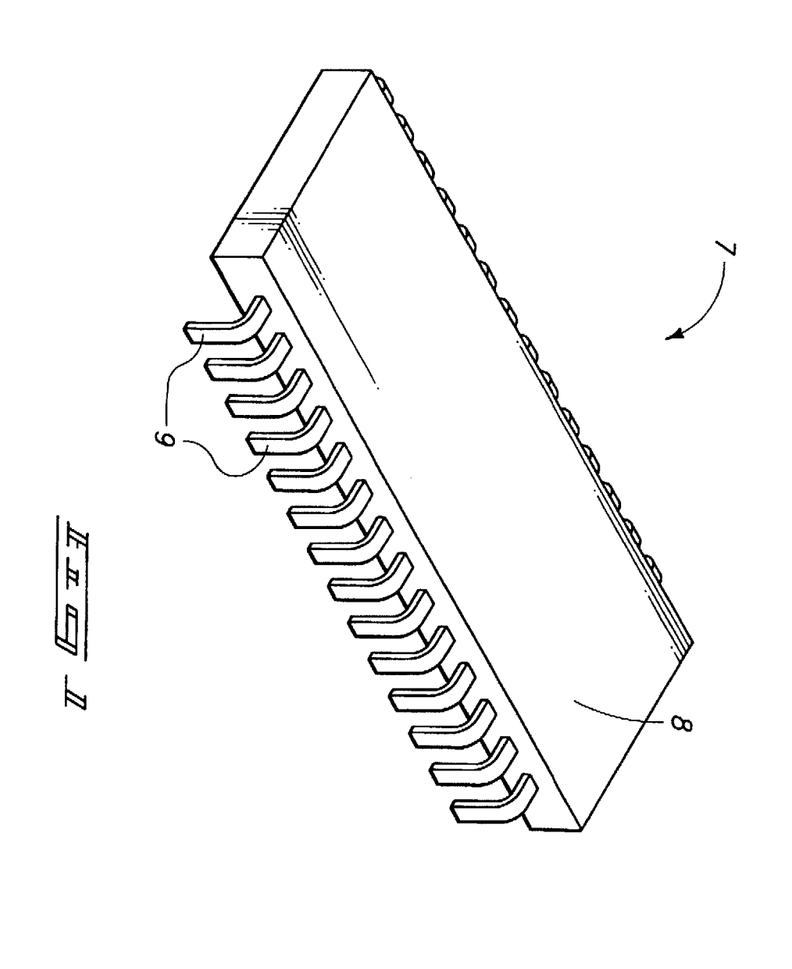
FIG. 1 is a perspective view of an integrated circuit embodying the invention.

FIG. 1 shows an integrated circuit 7 embodying the invention. The integrated circuit 7 includes a housing 8, and a plurality of pins 9. The housing 8 of the integrated circuit 7 houses circuitry described below in greater detail. More particularly, the integrated circuit 7 comprises a dynamic random access memory (DRAM) device 10.

Figure 2:
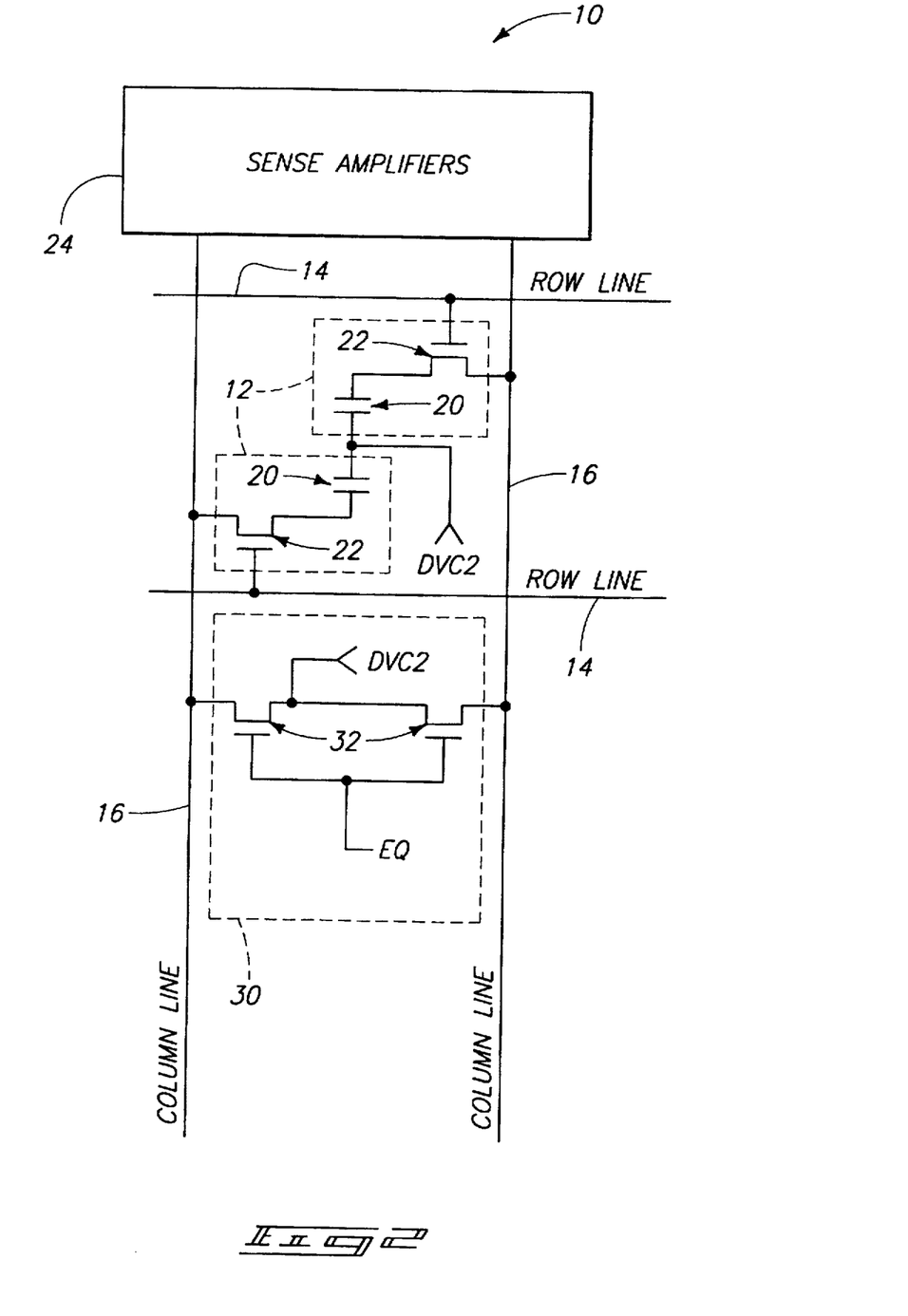
FIG. 2 is a schematic diagram of a dynamic random access memory device included in the integrated circuit of FIG. 1.

FIG. 2 shows a portion of the DRAM device 10. DRAM 10 includes a plurality of dynamic memory cells or units 12, a plurality of row or word lines 14, and a plurality of column or bit lines 16. Only two memory cells 12, two row lines 14, and two column lines 16 are shown in FIG. 2.

The dynamic memory cells of DRAM 10 are arranged in memory array columns which each include numerous memory cell pairs such as the single pair shown. Each column might contain, for example, 1024 or 2048 pairs of memory cells. Each memory cell 12 comprises a storage capacitor or cell 20 and an access switch or device 22 which is preferably an n-channel metal oxide silicon field effect transistor.

Dynamic memory cell 20 is operated by and with reference to upper and lower supply voltages. The lower supply voltage is typically referred to as ground. A first side or cell plate of storage cell 20 is connected to an intermediate reference voltage between the upper supply voltage and ground. This reference voltage is typically equal to the average of the upper and lower memory cell supply voltages. It is produced by a cell plate generator circuit, and is referred to as DVC2. The first cell plates of all storage cells 20 are typically formed by a single conducting layer within memory device 10, so that they are at a common electrical potential equal to reference voltage DVC2.

A second side or plate of storage cell 10 is connected to one active terminal of access device 22. One of column lines 16 is connected to the other active terminal of access device 22. The gate or control terminal of access device 22 is connected to one of row lines 14. Each memory unit 12 is therefore connected to both a row line 14 and a column line 16.

The row lines and column lines form a two-dimensional matrix having a plurality of intersections. A single memory cell 12 corresponds to each intersection between a row line and a column line. At a single such intersection, a row line is connected to selectively activate the corresponding memory unit. Activating the memory unit connects the memory unit's storage capacitor to the corresponding column line to allow conventional memory access operations such as reading, writing, or refreshing.

Column lines are associated with sense amplifiers. Each pair of column lines has a column line equilibrate circuit 30. Each equilibrate circuit 30 includes a pair of equilibrate transistors 32. One active terminal of each equilibrate transistor is connected to receive the cell plate reference voltage DVC2. The other active terminal of each equilibrate transistor 32 is connected to one of the adjacent column lines 16. Equilibrate circuits 30 are responsive to an equilibrate signal EQ to simultaneously connect reference voltage DVC2 to the column lines. During normal memory access operations, equilibrate signal EQ is activated to "pre-charge" the column lines to intermediate reference voltage DVC2 prior to activating transfer devices 22 and accessing memory cells.

The memory functions of memory device 10 are performed by storage cells 20. The first cell plate of each memory cell 12 is maintained at a non-varying intermediate voltage-reference voltage DVC2. The second cell plate is charged to either the upper supply voltage or the lower supply voltage (ground), depending on whether a binary 1 or 0 is being written to the memory cell 12. Reading a memory cell 12 is performed by detecting whether the memory cell's second plate is above or below the intermediate reference voltage.

Conventional timing signals, including a RAS (Row Address Strobe) signal and a CAS (Column Address Strobe) signal are used to refresh a memory cell, or to read or write to a memory cell 12. Timing diagrams including RAS and CAS signals, and detailed descriptions of DRAM operations and constructions are disclosed in *DRAM Data Book*, 1995, which is available from Micron Technology, Inc., 2805 East Columbia Road, P.O. Box 6, Boise, Id. 83707-0006.

Figure 3:
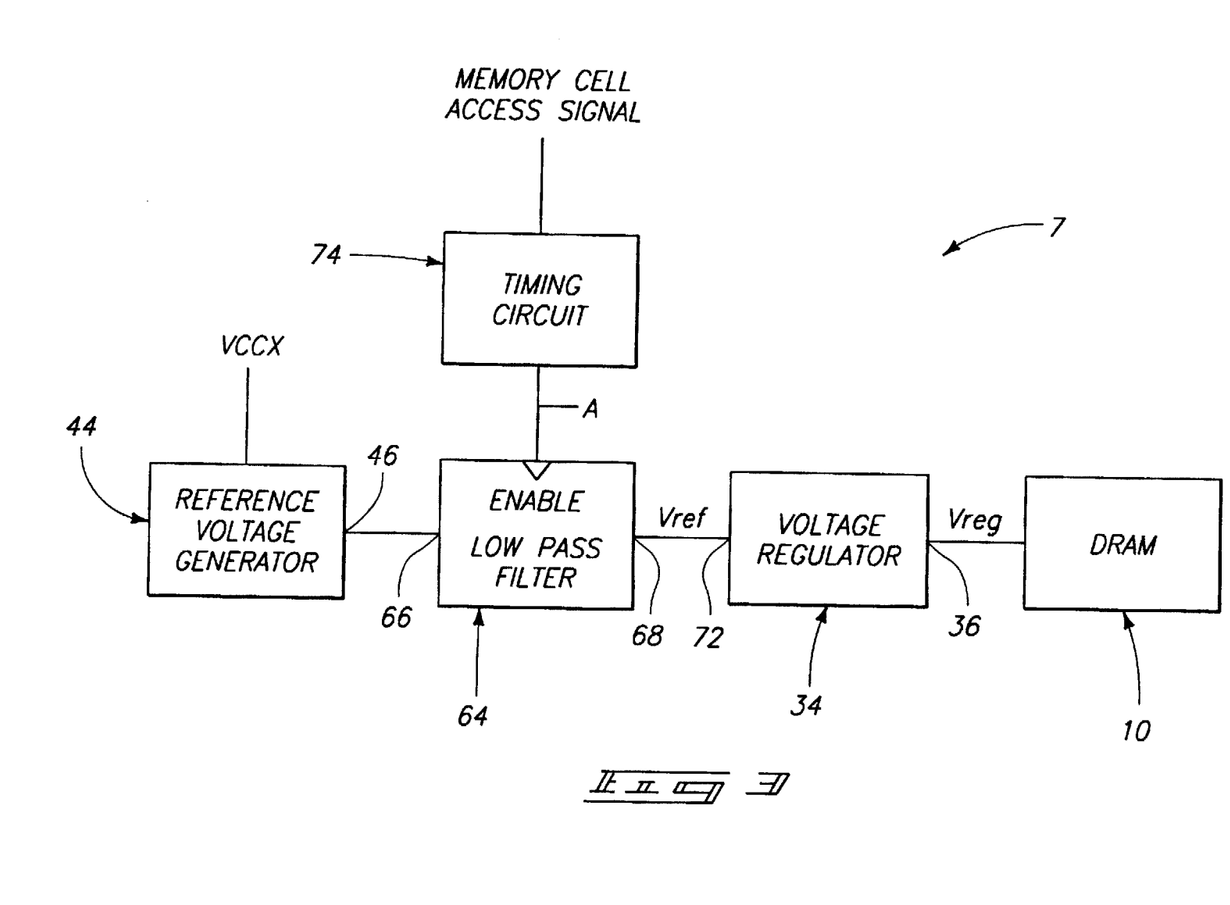
FIG. 3 is a block diagram of the circuitry included in the integrated circuit of FIG. 1.
Figure 5:
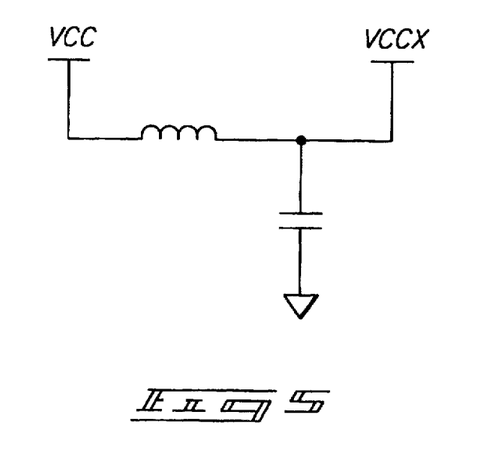
FIG. 5 is a circuit model diagram illustrating how the voltage VCCX results from source voltage supplied to the integrated circuit.

The integrated circuit 7 further comprises a voltage regulator 34 having an output 36 supplying a regulated voltage $V_{reg}$ to the DRAM 10 (FIG. 3). In the illustrated embodiment, the upper supply voltage of the DRAM 10 is the regulated voltage $V_{reg}$ supplied by the voltage regulator 34. The voltage DVC2 is derived from the regulated voltage $V_{reg}$. Any appropriate voltage regulator design can be employed for the voltage regulator 34. For example, the voltage regulator 34 can be of a design similar to the design described in *A New On-chip Voltage Regulator for High Density CMOS DRAMs*, by R. S. Mao et al. The voltage regulator 34 can be an operational amplifier (op-amp) with or without gain. In FIG. 4, the illustrated voltage regulator 34 comprises an op-amp 38 with negative feedback, with a positive supply terminal 40 connected to VCCX, and with a negative supply terminal 42 connected to ground. VCCX is the on-chip voltage supply after taking into account the inductance L of the lead 9 which is connected to an external supply VCC (FIG. 5) when the integrated circuit is in use.

The regulated voltage $V_{reg}$ is also used to power other DRAM components such as the sense amplifiers 24, the equilibrate control circuit which provides the signal EQ to the equilibrate circuits 30, and other components (e.g., charge pumps, all control logic) which would normally be connected to $V_{CC}$ in a conventional, non-regulated, DRAM. Substantially all DRAM components other than output amplifiers are powered by the regulated voltage $V_{reg}$.

The integrated circuit 7 further comprises a reference voltage generator 44 having an output 46 providing a reference voltage. Any appropriate reference voltage generator design can be employed for the reference voltage generator 44. For example, the reference voltage generator 44 can comprise an op-amp with or without gain. In the illustrated embodiment the reference voltage generator 44 comprises a resistor divider 48 having a series pair of resistors 50 and 52 connected between VCCX and ground, and an op-amp 54 with negative feedback, having a non-inverting input 56 connected to a center tap 58 between the resistors 50 and 52, having a positive supply terminal 60 connected to VCCX and having a negative supply terminal 62 connected to ground. Other op-amp designs are disclosed in *Microelectronic Circuits*, Adel S. Sedra and Kenneth C. Smith, 1987, CBS College Publishing.

The integrated circuit further comprises means, other than the voltage regulator 34, for maintaining the operating voltage steady during reading and writing to the memory cell 12, and during refresh of the memory cell 12. In the illustrated embodiment, the maintaining means comprises means for filtering the output 46 of the reference voltage generator 44. More particularly, the integrated circuit 7 comprises a filter 64 having an input 66 connected to the output 46 of the reference voltage generator 44, and having an output 68 providing a selectively filtered, regulated, voltage $V_{ref}$. In the illustrated embodiment, the filter 64 is a low pass filter. Any appropriate low pass filter design can be employed for the low pass Filter 64. For example, in the illustrated embodiment the low pass filter 64 comprises a resistor-capacitor network 70. Other filter designs are disclosed in *Microelectronic Circuits*, Adel S. Sedra and Kenneth C. Smith, 1987, CBS College Publishing.

The voltage regulator 34 has an input 72 connected to the output 68 of the Filter 64. The voltage regulator 34 accepts the voltage $V_{ref}$ and provides the regulated voltage $V_{reg}$ at the output 36. The voltage regulator 34 is designed to provide a steady output as long as the voltage $V_{ref}$ stays within a predetermined range of voltages. For example, the voltage regulator described in *A New On-chip Voltage Regulator for High Density CMOS DRAMs*, by R. S. Mao et al. accepts an external power supply of approximately 5 Volts and generates 3.3 Volts on chip. At 25° C., the voltage regulator described in the Mao article maintains an output of 3.3 Volts for input voltages varying between 3.3 to 6.2 Volts. If the input voltage exceeds 6.3 Volts, the voltage regulator described in the Mao article enters a burn-in mode and voltage output follows ⅔ of voltage input.

The low pass Filter 64 can either be always on, or selectively activated (or bypassed). In many cases, it would be undesirable for the filter 64 to be always enabled because the voltage $V_{ref}$ may be too slow in reflecting a desired response to a change in VCCX. In other 24 words, it may be difficult to design a filter that both removes undesired noise, and has the required response characteristics in all situations. Therefore, in the preferred embodiment, the filter 64 is selectively engageable (or selectively bypassed). For example, in the illustrated embodiment, the integrated circuit 7 further comprises a timing circuit 74 which engages the filter 64 in response to presence of a first signal, and causes the filter 64 to filter the reference voltage. The timing circuit 74 engages the filter 64 in response to presence of a signal indicative of a memory cell 12 being accessed. For example, the timing circuit preferably engages the filter 64 coincident with or a predetermined time after a RAS, CAS, $\overline{RAS}$ or $\overline{CAS}$ signal rises or falls. Because timing of memory cell accessing is predictable in both start and duration, the filter 64 can be timed to be turned on during accessing (read/write and refresh) of memory cells 12. Alternatively, or in addition, the filter 64 can be timed to be turned on when known predictable undesirable VCCX effects or noise functions are expected. For example, charge pumps create predictable noise functions. Any appropriate design may be employed for the timing circuit 74. For example, in the illustrated embodiment the timing circuit 74 comprises a NOR gate 76 having one input 78 connected to a RAS signal generator 80, and having another input connected to series connected inverter and delay gates 84 and 86 (FIG. 4). The NOR gate 76 also has an output 88 producing a timing signal A. The series connected inverter and delay gates 84 and 86 have an input 90 connected to the RAS signal generator 80. The integrated circuit 7 further includes a switch Q1 which is controlled by the timing signal A, and which turns on the filter when signal A rises (FIG. 6).

In alternative embodiments (not shown), the regulated voltage $V_{reg}$ is supplied to components other than DRAM components, and the timing circuit is triggered by an appropriate signal other than a RAS signal.

Figure 6:
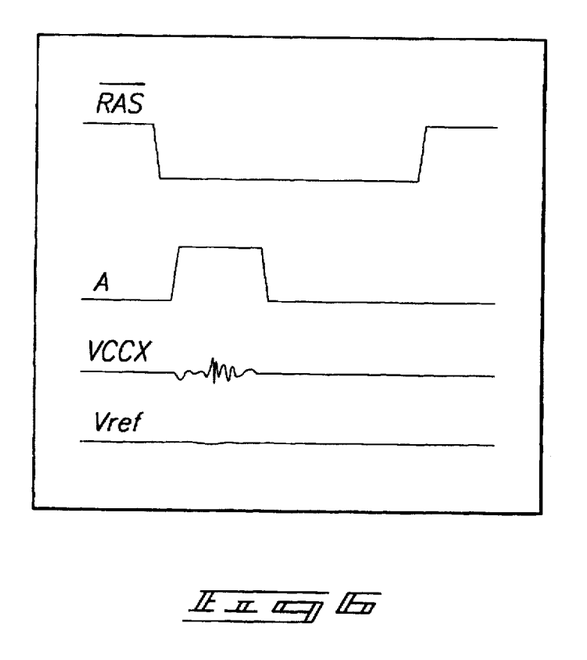
FIG. 6 is a timing diagram illustrating timing of activation of filter circuitry included in the circuitry shown in FIG. 4.
Figure 7:
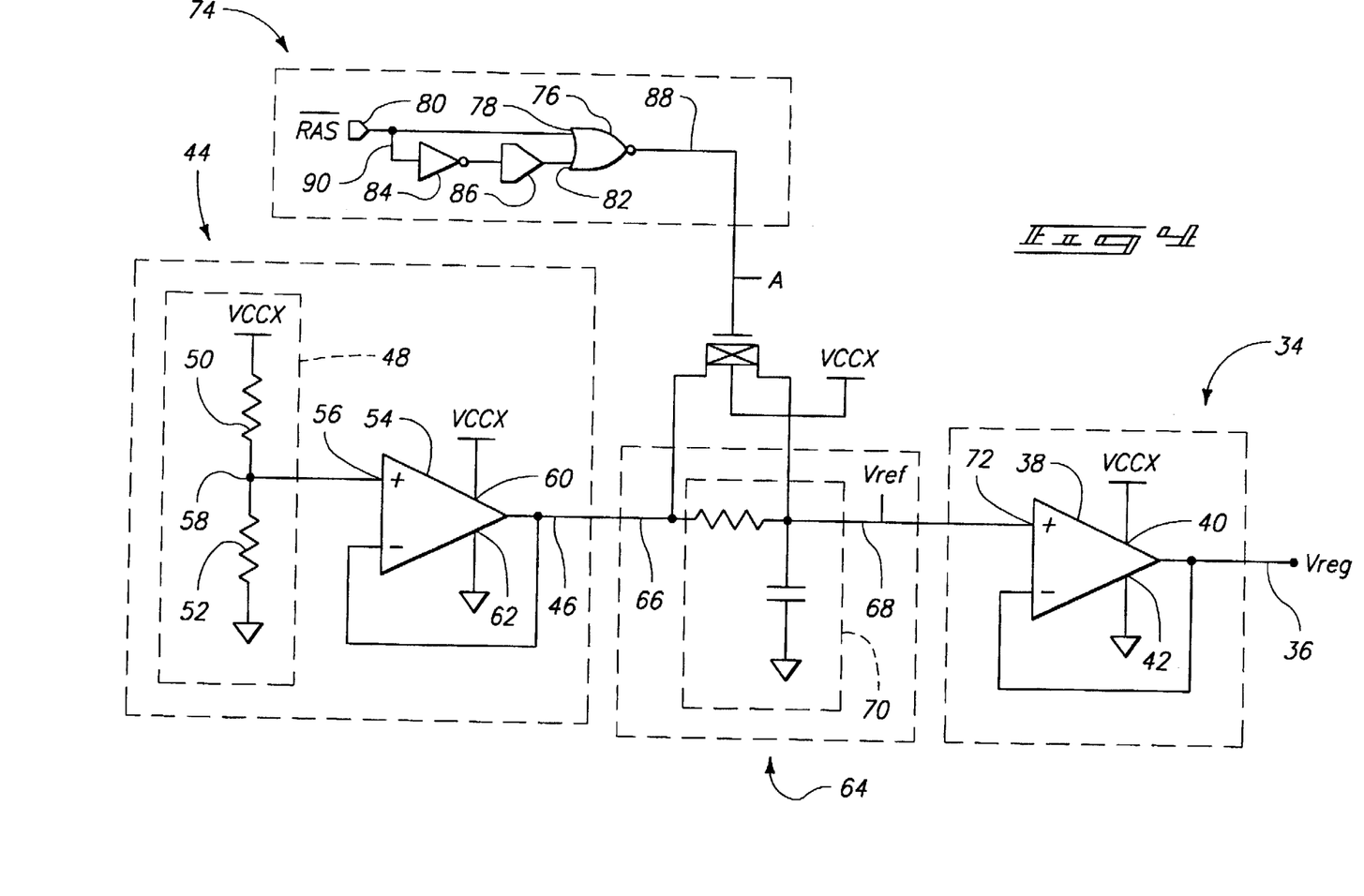

FIG. 6 shows the preferred timing relationship between $\overline{RAS}$ (RAS NOT, the inverse of RAS) and the signal A, and shows the difference between VCCX and the ffitered voltage $V_{ref}$ output by the filter 64. In the illustrated embodiment, the timing circuit 74 engages the filter 64 coincident with the start of a RAS signal, and for a period of time during which the RAS signal is present. More particularly, in the illustrated embodiment, the timing circuit 74 engages the filter 64 coincident with the start of a RAS signal, and for a period of time less than the period during which the RAS signal is present.

Thus, the invention provides a method of increasing the speed of operation of an integrated circuit including a dynamic random access memory having memory cells which are individually accessed in response to a signal, including a reference voltage generator having an output, and including a voltage regulator which accepts the output of the reference voltage generator and supplies voltage to the dynamic random access memory, by filtering the output of a reference voltage generator in response to the signal.

In compliance with the statute, the invention has been described in language more or less specific as to structural and methodical features. It is to be understood, however, that the invention is not limited to the specific features shown and descried, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A circuit comprising:
    a reference voltage generator having an output configured to provide a DC reference voltage;.
    a dynamic random access memory having a memory cell which is selectively refreshed in response to a signal;
    a voltage regulator having an input, and having an output which supplies an operating voltage to the dynamic random access memory; and
    a selectively engageable filter having an output coupled to the input of the voltage regulator, and having an input coupled to the output of the reference voltage generator, the filter being engaged to filter the reference voltage during refreshing of the memory cell.

2. A circuit in accordance with claim 1 wherein the filter filters the output of the reference voltage generator in response to the signal.

3. A circuit in accordance with claim 1 wherein the filter comprises a low pass filter.

4. A circuit comprising:
    a dynamic random access memory having a memory cell which is selectively refreshed in response to a RAS signal;
    a voltage regulator having an input, and having an output which supplies an operating voltage to the dynamic random access memory; and
    a selectively engageable filter having an output coupled to the input of the voltage regulator and having an input adapted to be coupled to a reference voltage, the filter being engaged to filter the reference voltage during refreshing of the memory cell.

5. A circuit in accordance with claim 1 and further comprising an integrated circuit package housing the dynamic random access memory, the voltage regulator, and the filter.

6. A circuit comprising:
    a dynamic random access memory having a memory cell which is selectively refreshed in response to a signal, the memory cell including a first plate adapted to be coupled to a first voltage and a second cell selectively coupled to an upper voltage higher than the first voltage to write data of a first value to the cell, or coupled to a lower voltage lower than the first voltage to write data of a second value to the cell;
    a voltage regulator connected to supply the upper voltage to the dynamic random access memory; and
    a selectively engageable filter configured to impede reduction of the upper voltage during refreshing of the memory cell.

7. A circuit in accordance with claim 6 and further comprising a reference voltage generator including an output providing a reference voltage, wherein the voltage regulator accepts the output of the reference voltage generator, and wherein the filter filters the output of the reference voltage generator in response to the signal.

8. A circuit in accordance with claim 6 and further comprising a reference voltage generator including an output providing a reference voltage, wherein the voltage regulator accepts the output of the reference voltage regulator, and wherein the filter comprises a low pass filter filtering the output of the reference voltage generator.

9. A circuit comprising:
a dynamic random access memory having a memory cell which is selectively refreshed in response to a RAS signal:
a voltage regulator which supplies an operating voltage to the dynamic random access memory; and
a selectively engageable filter configured to maintain the operating voltage steady during refreshing of the memory cell.

10. A circuit in accordance with claim 6 and further comprising an integrated circuit package housing the dynamic random access memory, the voltage regulator, and the filter.

11. A circuit comprising:
a reference voltage generator having an output providing a reference voltage;
a selectively engageable low pass filter having an input connected to the output of the reference voltage generator, and having an output;
a voltage regulator having an input connected to the output of the filter, and having an output;
a dynamic random access memory receiving power from the output of the voltage regulator, the dynamic random access memory having memory cells that are refreshed in response to a signal; and
a timing circuit which engages the filter in response to the signal, the filter tinkering the reference voltage for a period of time during which the signal is present.

12. An integrated circuit in accordance with claim 11 wherein the filter comprises a resistor-capacitor network.

13. An integrated circuit in accordance with claim 11 wherein the memory cells are refreshed in response to a RAS signal.

14. A circuit comprising:
a reference voltage generator having an output configured to provide a DC reference voltage;
a dynamic random access memory having a memory cell which is selectively accessed in response to a signal;
a voltage regulator having an input, and having an output which supplies an operating voltage to the dynamic random access memory; and
a selectively engageable filter having an output coupled to the input of the voltage regulator and having an input coupled to the output of the reference generator, the filter being engaged to filter the reference voltage during accessing of the memory cell.

15. A circuit in accordance with claim 14 wherein the filter filters the output of the reference voltage generator in response to the signal.

16. A circuit in accordance with claim 14 wherein the filter comprises a low pass filter.

17. A circuit comprising:
a dynamic random access memory having a memory cell which is selectively accessed in response to a RAS signal:
a voltage regulator having an input, and having an output which supplies an operating voltage to the dynamic random access memory; and
a selectively engageable filter having an output coupled to the input of the voltage regulator, and having an input adapted to be coupled to a reference voltage, the filter being engaged to filter the reference voltage during accessing of the memory cell.

18. A circuit in accordance with claim 14 and further comprising an integrated circuit package housing the dynamic random access memory, the voltage regulator, and the filter.

19. A circuit comprising:
a dynamic random access memory having a memory cell which is selectively accessed in response to a signal, the memory cell including a first plate adapted to be coupled to a first voltage and a second cell selectively coupled to an upper voltage higher than the first voltage to write data of a first value to the cell, or coupled to a lower voltage lower than the first voltage to write data of a second value to the cell;
a voltage regulator connected to supply the upper voltage to the dynamic random access memory; and
a selectively engageable filter configured to impede reduction of the upper voltage during accessing of the memory cell.

20. A circuit in accordance with claim 19 and further comprising a reference voltage generator including an output providing a reference voltage, wherein the voltage regulator accepts the output of the reference voltage generator, and wherein the filter filters the output of the reference voltage generator in response to the signal.

21. A circuit in accordance with claim 19 and further comprising a reference voltage generator including an output providing a reference voltage, wherein the voltage regulator accepts the output of the reference voltage regulator, and wherein the filter comprises a low pass filter filtering the output of the reference voltage generator.

22. A circuit comprising:
a dynamic random access memory having a memory cell which is selectively accessed in response to a RAS signal:
a voltage regulator which supplies an operating voltage to the dynamic random access memory; and
a selectively engageable filter configured to maintain the operating voltage steady during accessing of the memory cell.

23. A circuit in accordance with claim 19 and further comprising an integrated circuit package housing the dynamic random access memory, the voltage regulator, and the filter.

24. A circuit comprising:
a reference voltage generator having an output providing a reference voltage;
a selectively engageable low pass filter having an input connected to the output of the reference voltage generator, and having an output;
a voltage regulator having an input connected to the output of the filter, and having an output;
a dynamic random access memory receiving power from the output of the voltage regulator, the dynamic random access memory having memory cells that are accessed in response to a signal; and
a timing circuit which engages the filter in response to the signal, the filter filtering the reference voltage for a period of time during which the signal is present.

25. An integrated circuit in accordance with claim 24 wherein the filter comprises a resistor-capacitor network.

26. A circuit comprising:
- a reference voltage generator having an output providing a reference voltage;
- a selectively engageable low pass filter having an input connected to the output of the reference voltage generator, and having an output;
- a voltage regulator having an input connected to the output of the filter, and having an output;
- a dynamic random access memory receiving power from the output of the voltage regulator, the dynamic random access memory having memory cells that are accessed in response to a RAS signal; and
- a timing circuit which engages the filter in response to the signal, the filter filtering the reference voltage for a period of time during which the signal is present.

* * * * *

UNITED STATES PATENT AND TRADEMARK OFFICE
CERTIFICATE OF CORRECTION

PATENT NO.    : 5,710,740
DATED         : January 20, 1998
INVENTOR(S)   : Troy A. Manning It is certified that error appears in the above-identified patent and that said Letters Patent is hereby corrected as shown below:

Column 3, Line 26, replace "10" with --20--.

Column 4, Line 63, replace "Filter" with --filter--.

Column 5, Line 2, replace "Filter" with --filter--.

Column 5, Line 19, delete "24".

Column 5, Line 57, replace "ffitered" with --filtered--.

Column 6, Line 12, replace "descried" with --described--.

Column 7, Line 38, replace "tinkering" with --filtering--.

Signed and Sealed this

Twenty-ninth Day of December, 1998

Attest:

BRUCE LEHMAN

Attesting Officer    Commissioner of Patents and Trademarks